(12) United States Patent
Huang

(10) Patent No.: US 9,967,992 B2
(45) Date of Patent: May 8, 2018

(54) PCB FIXING MECHANISM AND LIQUID CRYSTAL DISPLAY DEVICE

(71) Applicant: Shenzhen China Star Optoelectronics Technology Co., Ltd., Shenzhen (CN)

(72) Inventor: Xiaoyu Huang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 230 days.

(21) Appl. No.: 15/039,413

(22) PCT Filed: Apr. 8, 2016

(86) PCT No.: PCT/CN2016/078887
§ 371 (c)(1),
(2) Date: May 25, 2016

(87) PCT Pub. No.: WO2017/152458
PCT Pub. Date: Sep. 14, 2017

(65) Prior Publication Data
US 2018/0098451 A1    Apr. 5, 2018

(30) Foreign Application Priority Data
Mar. 9, 2016    (CN) .......................... 2016 1 0134380

(51) Int. Cl.
*H05K 7/14*    (2006.01)
*H05K 3/30*    (2006.01)
(Continued)

(52) U.S. Cl.
CPC ..... *H05K 7/1422* (2013.01); *G02F 1/133308* (2013.01); *H05K 3/301* (2013.01);
(Continued)

(58) Field of Classification Search
CPC .. H05K 7/1417; H05K 7/1422; H05K 7/1427; H05K 7/1438; H05K 3/301;
(Continued)

(56) References Cited

U.S. PATENT DOCUMENTS 7,089,646 B2 *  8/2006  Leerkamp .............. H05K 9/003
                                                        174/373
7,177,161 B2 *  2/2007  Shima ................... H04B 15/00
                                                        174/350
(Continued)

FOREIGN PATENT DOCUMENTS

CN          104837327 A       8/2015

*Primary Examiner* — Hoa C Nguyen
(74) *Attorney, Agent, or Firm* — Leong C. Lei

(57) ABSTRACT

The present invention provides a PCB Fixing Mechanism and Liquid Crystal Display Device. The PCB fixing mechanism utilizes annular conducting foam (30) and conductive adhesive (20) to fix PCB (50) on the back plate (10), then improve the contact efficiency between PCB (50) and back plate (10). In cooperate with compressing annular conducting foam by PCB hood (40), the annular conducting foam obtain great conductivity with sufficient compress ratio ensured, further improve PCB grounding, thus can promptly and effectively bypass ESD interference to prevent electrostatic damage. By the way, PCB fixing procedure is simplified and labor hours are saved. The liquid crystal display device using aforesaid PCB fixing mechanism, can simplify PCB fixing procedure, save labor hours, improve PCB grounding and prevent electrostatic damage.

15 Claims, 4 Drawing Sheets

(51) Int. Cl.
  *H05K 9/00*      (2006.01)
  *G02F 1/1333*    (2006.01)
  *H05K 3/32*      (2006.01)

(52) U.S. Cl.
  CPC ............. *H05K 3/32* (2013.01); *H05K 7/1417* (2013.01); *H05K 7/1438* (2013.01); *H05K 9/0079* (2013.01)

(58) Field of Classification Search
  CPC .... H05K 3/321; H05K 9/0079; H05K 9/0081; G02F 1/133
  See application file for complete search history.

(56) References Cited

U.S. PATENT DOCUMENTS

| | | | |
|---|---|---|---|
| 9,048,124 B2 * | 6/2015 | Dolci ..................... | H01L 23/10 |
| 9,179,538 B2 * | 11/2015 | Foster ................... | H05K 1/0218 |
| 2004/0041175 A1 * | 3/2004 | Anderson ........... | G06F 17/5054 |
| | | | 257/202 |
| 2005/0206468 A1 * | 9/2005 | Kimata ................ | H05K 9/0026 |
| | | | 333/12 |
| 2006/0086518 A1 * | 4/2006 | Kawaguchi ............ | H05K 9/003 |
| | | | 174/377 |
| 2011/0090631 A1 * | 4/2011 | Atkinson ................ | G06F 1/203 |
| | | | 361/679.26 |
| 2014/0078719 A1 * | 3/2014 | Jung ........................ | H05K 5/02 |
| | | | 362/97.1 |

* cited by examiner

PCB FIXING MECHANISM AND LIQUID CRYSTAL DISPLAY DEVICE

FIELD OF THE INVENTION

The present invention relates to a display manufacturing field, and more particularly to a PCB fixing mechanism and liquid crystal display device.

BACKGROUND OF THE INVENTION

The LCD (Liquid Crystal Display) possesses advantages of thin body, power saving, no radiation, to be widely used such as: LCD TVs, mobile phones, personal digital assistant (PDA), digital camera, computer screen or laptop screen, occupies the leading position in the flat panel display area.

The TFT-LCD (Thin Film Transistor Liquid Crystal Display) is one of the major types of flat panel display, the thin-film transistor liquid crystal display control picture display in advance with thin-film transistor switches control how data signal is entered.

Specifically, see FIG. 1, primary driving principle for TFT-LCD is, system board (not shown) is connected to the connector 100 on PCB 200 (Printed Circuit Board) by cable. Data such as R/G/B compressed signal and control signal and driving signal, will be processed by timing controller (TCON) in printed circuit board 200. The data goes to display area 500 through the source terminal (Source-Chip on Film, S-COF) 300 and gate terminals (Gate-Chip on Film, G-COF) 400, then provide required signals for LCD to display on screen.

Electrostatic discharge (ESD) is charge transfer induced by objects with different electrostatic potential getting close to each other or direct contacted. Electrostatic damage happened when electrostatic discharge instantaneously generates thousands of volts which will cause TFT-LCD malfunction. To prevent electrostatic damage, PCB ground is required for ESD protection.

In traditional design, working procedure is complicated while mounting PCB on back plate by screws or buckles, then poor contact between PCB and back plate easily happened because the contact of screws or buckles is uncontrollable, thus PCB grounding quality is not guaranteed. While interferences like electrostatic discharge transferred to PCB from environment, it cannot be conduct promptly to the back plate then bad ESD happened. To resolve this problem, additional fixing mechanisms are required for traditional design to increase grounding quality, and the production cost also rises.

SUMMARY OF THE INVENTION

An object of the invention is to provide a PCB fixing mechanism, which will simplify PCB fixing process to save labor hours, improve PCB grounding quality to prevent electrostatic damage.

The other object of this invention is to provide a liquid crystal display device, which will simplify PCB fixing process to save labor hours, also improve PCB grounding quality to prevent electrostatic damage.

For realizing the aforesaid objective, the present invention provides a PCB fixing mechanism, comprising a back plate, a PCB mounted on the back plate, annular conducting foam binding the PCB, a conductive adhesive located between the annular conducting foam and the back plate, as well as a PCB hood to cover the PCB at an upper side of the back plate;

wherein the annular conducting foam bonded to the back plate by the conductive adhesive, and the PCB bound by the annular conducting foam is fixed on the back plate;

the PCB comprises a grounding region, and the annular conducting foams and the PCB grounding region are electrically connected;

a gap between top of the PCB hood and the PCB is less than a thickness of a portion of the annular conducting foam that is located between the PCB hood and the PCB in the uncompressed condition, such that the PCB grounding is enhanced by compressing the annular conducting foam with the PCB hood.

The back plate is a metal back plate.

The gap between top of the PCB hood and the PCB is greater than a height of a highest component on PCB.

The thickness of a portion of the annular conducting foam that is located between the PCB hood and the PCB in the uncompressed condition is greater than the height of a highest component on PCB.

The thickness of a portion of the annular conducting foam that is located between the PCB hood and the PCB in the uncompressed condition is 1.4 times of the height of a highest component on PCB.

An inner perimeter of the annular conducting foam is equal to a perimeter of a section of the PCB where the annular conducting foam is located.

The PCB comprises two grounding regions symmetrically arranged at two ends of the PCB, and upper and lower surfaces of the PCB at grounding regions including no components thereon.

The quantity for annular conducting foams is two, respectively fit in two grounding regions symmetrically arranged at the two ends of the PCB.

The present invention also provides a liquid crystal display device, comprising a body, a back plate installed on the body, a PCB mounted on the back plate, annular conducting foam binding the PCB, a conductive adhesive located between the annular conducting foam and the back plate, as well as a PCB hood covering the PCB at an upper side of the back plate;

wherein the annular conducting foam bonded to the back plate by the conductive adhesive, and the PCB fit in the annular conducting foam is fixed on the back plate;

the PCB comprises a grounding regions, and the annular conducting foam and the PCB grounding regions are electrically connected; and a gap between a top of the PCB hood and the PCB is less than the thickness of a portion of the annular conducting foam that is located between the PCB hood and the PCB in the uncompressed condition, and the PCB grounding is enhanced by compressing the annular conducting foam with the PCB hood.

The gap between top of the PCB hood and the PCB is greater than a height of a highest component on PCB;

the thickness of a portion of the annular conducting foam that is located between the PCB hood and the PCB in the uncompressed condition, is greater than the height of a highest component on PCB;

An inner perimeter of the annular conducting foam is equal to a perimeter a section of the PCB where the annular conducting foam is located.

The present invention also provides a PCB fixing mechanism, comprising a back plate, a PCB mounted on the back plate, an annular conducting foam binding the PCB, a conductive adhesive located between the annular conducting foam and the back plate, as well as a PCB hood covering the PCB at an upper side of the back plate;

wherein the annular conducting foam bonded to the back plate by the conductive adhesive, and the PCB fit in the annular conducting foam is fixed on the back plate;

the PCB comprises a grounding region, the annular conducting foam and the PCB grounding regions are electrically connected; and a gap between a top of the PCB hood and the PCB is less than the thickness of a portion of the annular conducting foam that is located between the PCB hood and the PCB in the uncompressed condition, and the PCB grounding is enhanced by compressing the annular conducting foam with the PCB hood;

wherein the back plate is a metal back plate;

wherein the gap between top of the PCB hood and the PCB is greater than the height of a highest component on the PCB;

wherein the thickness of a portion of the annular conducting foam that is located between the PCB hood and the PCB in the uncompressed condition, is greater than the height of a highest component on PCB.

The benefits of the present invention are: the present invention provides a PCB fixing mechanism, this PCB fixing mechanism utilizes annular conducting foam and conductive adhesive to fix PCB on the back plate, then improve the contact efficiency between PCB and back plate; in cooperate with compressing annular conducting foam by PCB hood, the annular conducting foam obtain great conductivity with sufficient compress ratio ensured, further to improve PCB grounding. Consequently, promptly and effectively bypass ESD interference will prevent electrostatic damage, by the way PCB fixing procedure is simplified and labor hours are saved. The present invention also provides a liquid crystal display device using aforesaid PCB fixing mechanism, which can simplify PCB fixing procedure, save labor hours, improve PCB grounding and prevent electrostatic damage.

BRIEF DESCRIPTION OF THE DRAWINGS

In order to further understand the features and technical contents of the present invention, please reference below for a detailed description of the invention and drawings, drawings provide for reference and explanation only, however are not used to limit the invention.

In drawings.

DETAILED DESCRIPTION OF PREFERRED EMBODIMENTS

For further elaborating the technical solution in present invention and the effect, the present invention will be further described in detail with specific embodiment and attached drawings.

Figure 1:
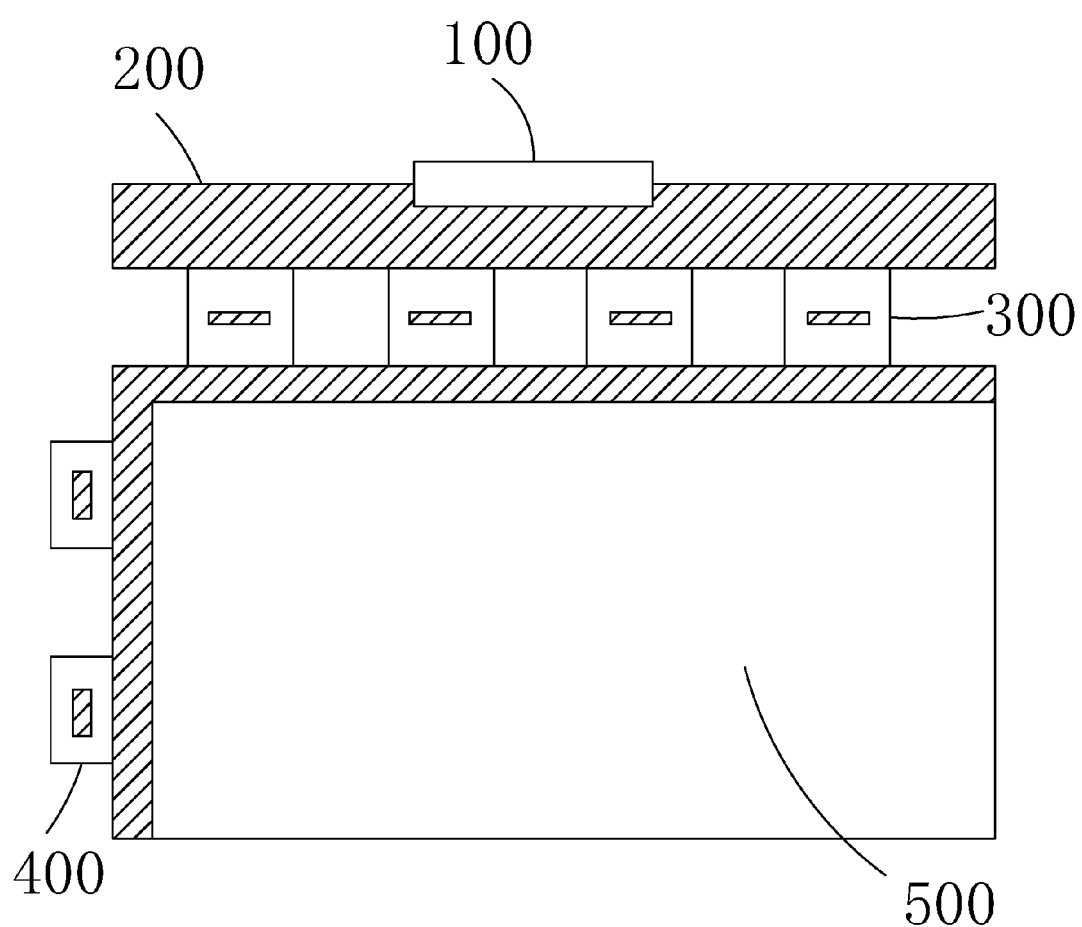
FIG. 1 is a schematic of driving structure for present thin film transistor liquid crystal display (TFT-LCD)
Figure 2:
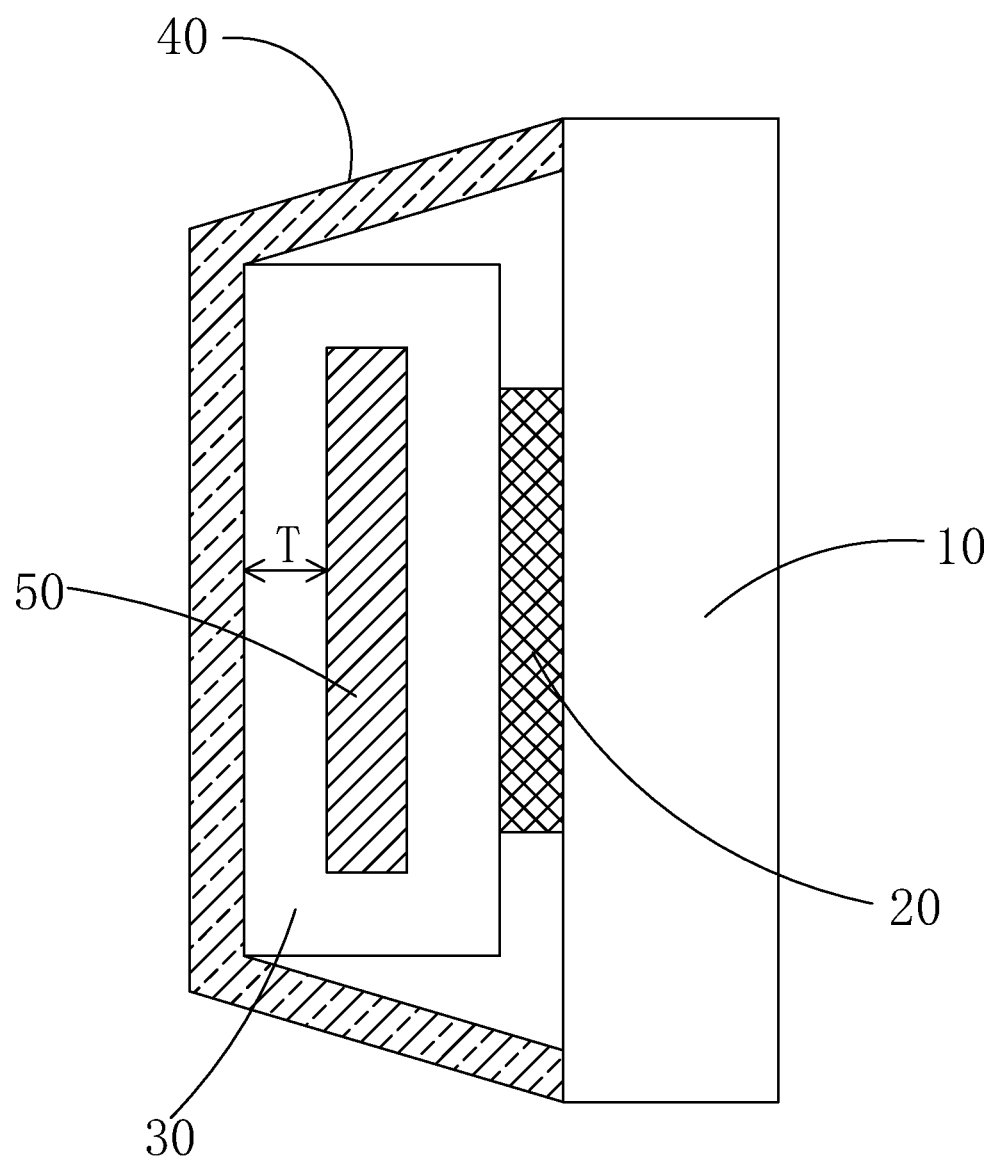
FIG. 2 is a sectional diagram of the PCB fixing mechanism according to the present invention.
Figure 3:
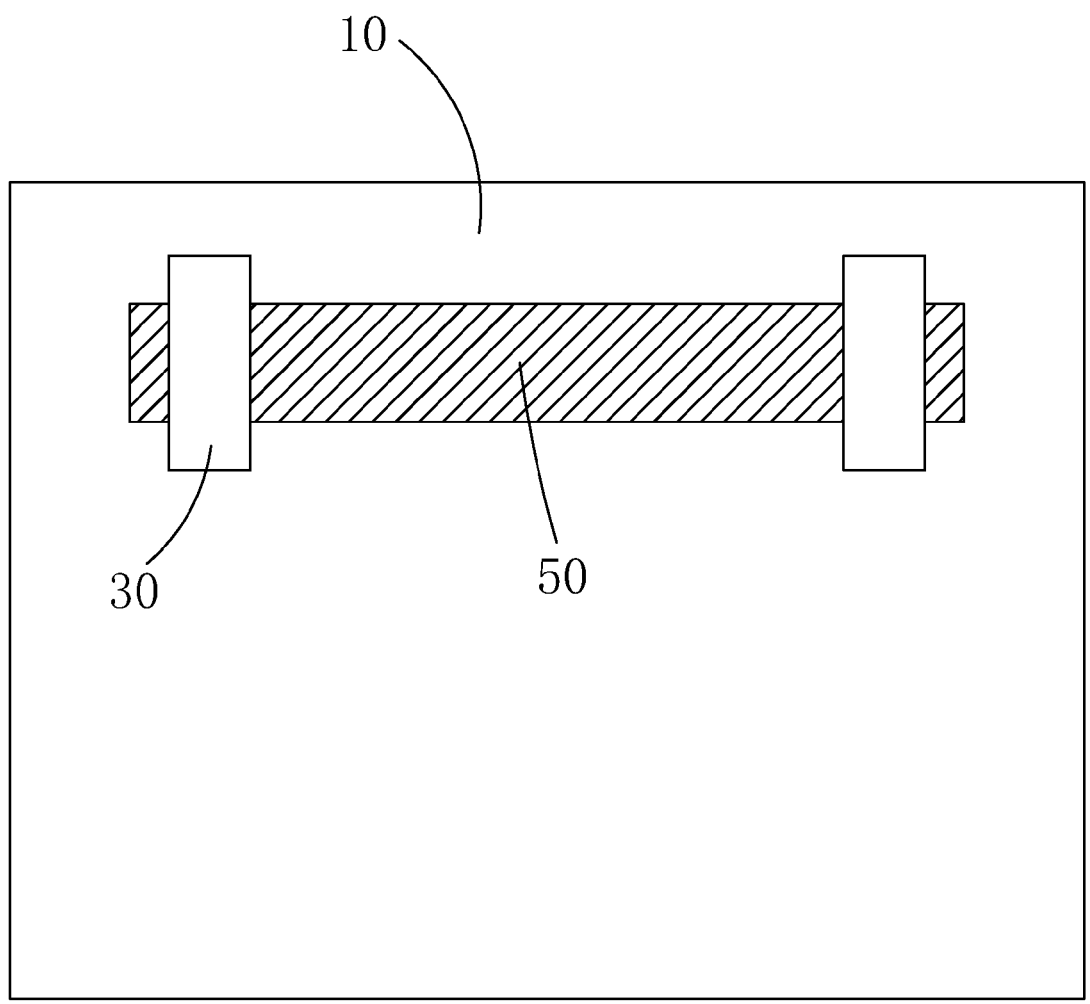
FIG. 3 is a schematic diagram of PCB fixing mechanism without PCB hood joined according to the present invention.

Please refer to FIG. 2, combining with FIG. 5, the present invention provides a PCB fixing mechanism, comprising a back plate 10, a PCB 50 mounted on back plate 10, an annular conducting foam 30 binding PCB 50, a conductive adhesive 20 located between the annular conducting foam 30 an the back plate 10, a PCB hood 40 covering the PCB 50 at an upper side of the back plate 10; the PCB 50 comprises grounding region, and the annular conducting foam 30 and the grounding region of PCB 50 are electrically contacted;

the PCB fixing mechanism bonding the annular conducting foam 30 to the back plate by the conductive adhesive 20, therefore the PCB 50 fit in the annular conducting foam 30 is fixed on the back plate 10; this fixing method enhances contact efficiency between the PCB 50 and the back plate 10, thus the PCB 50 grounding is improved;

An gap between an inner surface of the PCB hood 40 and an upper surface of the PCB 50 is less than a thickness T of a portion of the annular conducting foam that is located between the inner surface of the PCB hood 40 and the upper surface of PCB 50, therefore the annular conducting foam 30 obtained great conductivity with sufficient compress ratio ensured, that means the PCB 50 grounding is further improved with compressing the annular conducting foam 30 by the PCB hood 40.

Preferably, the back plate 10 is a metal back plate.

Specifically, components with different height are usually installed on the PCB 50, so we need to set up the gap between a top of the PCB hood 40 and the PCB 50 to be greater than a height of a highest component on PCB 50, in order to prevent component damaged by the PCB hood 40 pressing.

At the same time, we also setup the thickness T of the portion of the annular conducting foam 30 located between the PCB hood 40 and the PCB 50 in uncompressed condition, to be greater than the height a highest component on PCB 50. Thus the annular conducting foam 30 has space to be compressed, to ensure an sufficient compress ratio for annular conducting foam 30, then further to improve the PCB grounding. That means thickness T of the portion of the annular conducting foam 30 located between the PCB hood 40 and the PCB 50 in uncompressed condition, is somewhere in between, the distance to the top of the PCB hood 40 from the PCB 50, and the height of a highest component on PCB 50. Preferably, the thickness T of the portion of the annular conducting foam 30 located between PCB hood 40 and PCB 50 in uncompressed condition is 1.4 times of the height of a highest component on PCB 50. The annular conducting foam 30 is forced distortion by compressing the annual conducting foam 30 by the PCB hood 40, and more contact area then obtained for the annular conducting foam 30, the PCB hood 40 and the back plate 10, furthermore to improve the PCB grounding.

Specifically, an inner perimeter of the annular conducting foam 30 is equal to a perimeter of a section of the PCB 50 where the annular conducting foam 30 is located, and to make sure good contact between the annular conducting foam 30 and the PCB 50.

Preferably, the PCB 50 comprises two grounding regions symmetrically arranged at two ends of the PCB, the quantity for the annular conducting foams 30 is two, respectively fit in two grounding regions symmetrically arranged at the two ends of the PCB; meanwhile upper and lower surfaces of grounding region on PCB 50 including no components thereon, in order to make sure no components on PCB 50 will be damaged while fitting the annular conducting foam 30 into the CB 50. That is two symmetrical grounding regions are reserved at two ends of the PCB 50, then respectively fit in two annular conducting foams 30 at two grounding regions of the PCB 50 from both side, after that two annular conduction foams and PCB 50 are bonded to the back plate 10 with the conductive adhesive, then fixing the PCB 50 is completed after the PCB hood 40 covered.

Figure 4:
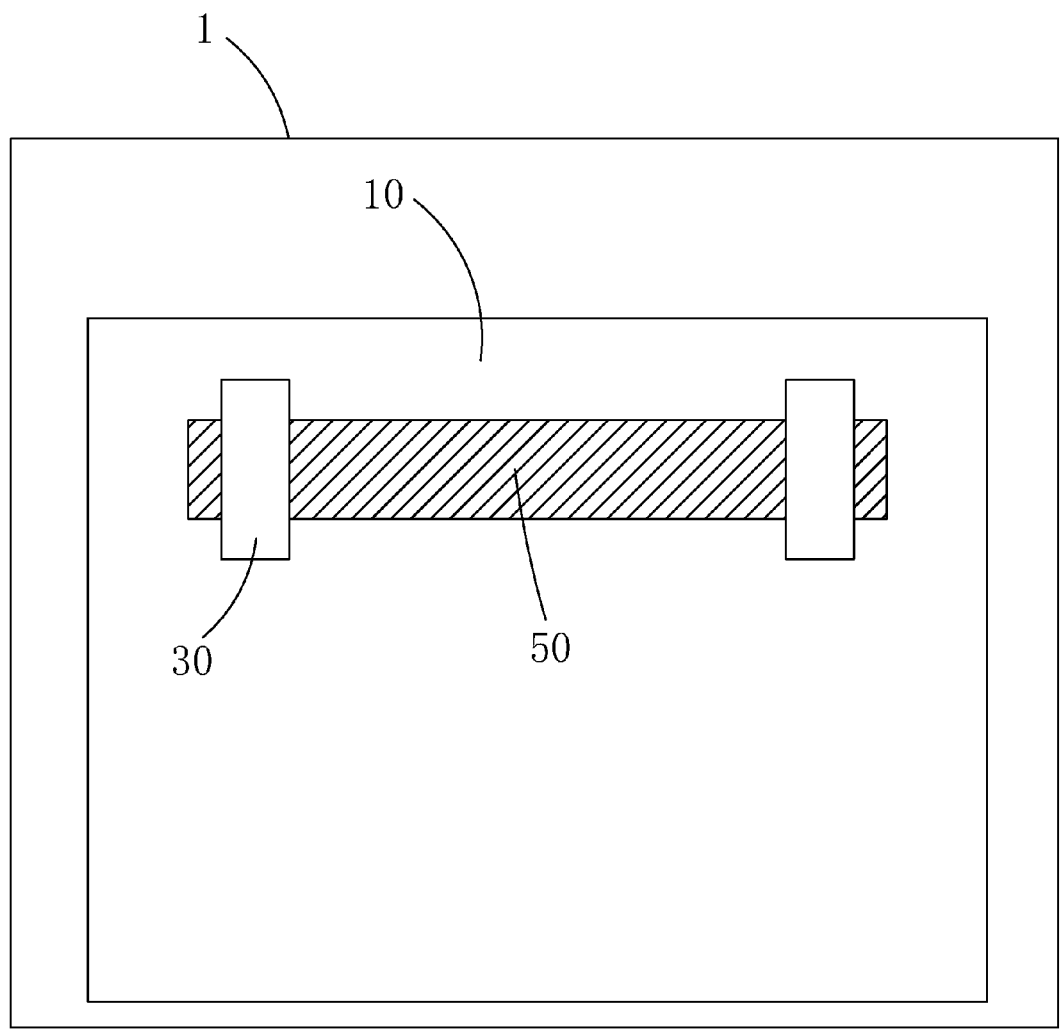
FIG. 4 is a structure diagram of the liquid crystal display device according to the present invention.

Please refer to FIG. 4, combining with FIG. 2, based on the PCB fixing mechanism above, the present invention also provides a liquid crystal display, comprising a body 1, a back plate 10 installed on the body 1, a PCB 50 located on the back plate 10, annular conducting foam 30 binding the PCB 50, a conductive adhesive 20 located between the annular conducting foam 30 and the back plate 10, and a PCB hood 40 covering the PCB 50 from an upper side of the back plate 10;

the PCB 50 comprises grounding region, and the annular conducting foam 30 and the grounding region of the PCB 50 are electrically contacted;

a gap between a top of the PCB hood 40 and the PCB 50 is less than the thickness of the portion of the annular conducting foam 30 located between the PCB hood 40 and the PCB 50. The PCB fixing mechanism utilizes bonding the annular conducting foam 30 to the back plate 10 by the conductive adhesive 20, consequently PCB 50 fit in the annular conducting foam 30 will be fixed on the back plate 10, and then to improve PCB grounding with compressing the annular conducting foam 30 by the PCB hood 40.

Specifically, a gap between top of the PCB hood 40 and the PCB 50 is greater than the height of a highest component on the PCB 50. The thickness of the portion of the annular conducting foam 30 located between the PCB hood 40 and the PCB 50 in uncompressed condition, is greater than the height of a highest components on the PCB 50. An inner perimeter of the annular conducting foam 30 is equal to a perimeter of the section of the PCB 50 where the annular conducting foam 30 is located.

In conclusion, the present invention provides a PCB fixing mechanism, this mechanism utilize annular conducting foam and conductive adhesive to fix PCB on the back plate, in order to enhance contact efficiency between PCB and back plate. In cooperate with compressing annular conducting foam by PCB hood, the annular conducting foam obtained great conductivity with sufficient compress ratio ensured, further enhances the PCB grounding. Consequently, we can bypass ESD interference promptly and effectively to prevent electrostatic damage. By the way to simplify PCB fixing procedure and saving labor hours. In addition, with applying aforesaid PCB fixing mechanism into liquid crystal display, we can simplify PCB fixing procedure, save labor hours, enhance the grounding of PCB and prevent electrostatic damage.

Above are only specific embodiments of present invention, the scope of the present invention is not limited to this, and to any persons who are skilled in the art, change or replacement which is easily derived should be covered by the protected scope of the invention. Thus, the protected scope of invention should go by the subject claims.

What is claimed is:

1. A printed circuit board (PCB) fixing mechanism, comprising a back plate, a PCB mounted on back plate, annular conducting foam binding the PCB, a conductive adhesive located between the annular conducting foam and the back plate, a PCB hood to covering the PCB at an upper side of the back plate;
   wherein the annular conducting foam is bonded to the back plate with the conductive adhesive, and the PCB fit in the annular conducting foam is fixed on the back plate;
   the PCB comprises a grounding region, the annular conducting foam and the PCB grounding region of the PCB are electrically connected; and
   a gap between a top of the PCB hood and the PCB is less than a thickness of a portion of the annular conducting foam that is located between the PCB hood and the PCB in an un compressed condition, such that the PCB grounding is enhanced by compressing the annular conducting foam with the PCB hood.

2. The PCB fixing mechanism according to claim 1, wherein the back plate is a metal back plate.

3. The PCB fixing mechanism according to claim 1, wherein the gap between top of the PCB hood and the PCB is greater than a height of a highest component on the PCB.

4. The PCB fixing mechanism according to claim 1, wherein the thickness of the portion of the annular conducting foam that is located between the PCB hood and the PCB in the uncompressed condition, is greater than the height of a highest component on the PCB.

5. The PCB fixing mechanism according to claim 4, wherein the thickness of the portion of the annular conducting foam located between the PCB hood and the PCB, is 1.4 times of the height of a highest component on the PCB.

6. The PCB fixing mechanism according to claim 1, wherein an inner perimeter of the annular conducting foam is equal to a perimeter of a section of the PCB where the annular conducting foam is located.

7. The PCB fixing mechanism according to claim 1, wherein the PCB comprises two grounding regions symmetrically arranged at two ends of the PCB, upper and lower surfaces of the PCB at the grounding regions including no components thereon.

8. The PCB fixing mechanism according to claim 7, wherein the quantity for annular conducting foam is two, respectively fit to the two grounding regions symmetrically arranged at two ends of the PCB.

9. A liquid crystal display device, comprising a body, a back plate installed on the body, a printed circuit board (PCB) mounted on the back plate, annular conducting foam binding the PCB, a conductive adhesive located between the annular conducting foam and the back plate, a PCB hood covering the PCB at an upper side of the back plate;
   wherein the annular conducting foam is bonded to the back plate with the conductive adhesive, and the PCB fit in the annular conducting foam is fixed on the back plate;
   the PCB comprises a grounding region, the annular conducting foam and the PCB grounding region of the PCB are electrically connected; and
   a gap between a top of the PCB hood and the PCB is less than a thickness of a portion of the annular conducting foam that is located between the PCB hood and the PCB in an un compressed condition, such that the PCB grounding is enhanced by compressing the annular conducting foam with the PCB hood.

10. The liquid crystal display device according to claim 9, wherein the gap between the top of the PCB hood and the PCB is greater than a height of a highest component on PCB;
   Wherein the thickness of a portion of the annular conducting foam located between the PCB hood and the PCB, is greater than the height of a highest component on PCB; and
   an inner perimeter of the annular conducting foam is equal to a perimeter of a section of the PCB where the annular conducting foam is located.

11. A printed circuit board (PCB) fixing mechanism, comprising a back plate, a PCB mounted on the back plate, annular conducting foam binding the PCB, a conductive adhesive located between the annular conducting foam and the back plate, a PCB hood covering the PCB at an upper side of the back plate;

wherein the annular conducting foam is bonded to the back plate with the conductive adhesive, and the PCB fit in the annular conducting foam is fixed on the back plate;

the PCB comprises a grounding region, and the annular conducting foam and the PCB grounding region are electrically connected;

a gap between a top of the PCB hood and the PCB is less than a thickness of a portion of the annular conducting foam that is located between the PCB hood and the PCB in an uncompressed condition, such that the PCB grounding is enhanced by compressing the annular conducting foam with the PCB hood;

wherein the back plate is a metal back plate;

wherein the gap between a top of the PCB hood and the PCB is greater than a height of a highest component on the PCB;

wherein thickness of a portion of the annular conducting foam that is located between the PCB hood and the PCB in an uncompressed condition, is greater than the height of a highest component on the PCB.

12. The PCB fixing mechanism according to claim 11, wherein the thickness of a portion of the annular conducting foam that is located between the PCB hood and the PCB in an uncompressed condition, is 1.4 times of the height of a highest component on the PCB.

13. The PCB fixing mechanism according to claim 11, wherein an inner perimeter of the annular conducting foam is equal to a perimeter of a section of the PCB where the annular conducting foam is located.

14. The PCB fixing mechanism according to claim 11, wherein the PCB comprises two grounding regions symmetrically arranged at two ends of the PCB, upper and lower surfaces of the PCB at the grounding regions including no components thereon.

15. The PCB fixing mechanism according to claim 14, wherein the quantity for the annular conducting foam is two, respectively fit to the two grounding regions symmetrically arranged at the two ends of the PCB.

* * * * *